United States Patent
Gouin

(10) Patent No.: US 8,004,918 B2
(45) Date of Patent: Aug. 23, 2011

(54) MEMORY CELL HEATING ELEMENTS

(75) Inventor: Vincent Gouin, Mandelieu (FR)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 12/411,227

(22) Filed: Mar. 25, 2009

(65) Prior Publication Data

US 2010/0246235 A1    Sep. 30, 2010

(51) Int. Cl.
*G11C 7/04* (2006.01)
(52) U.S. Cl. .................. 365/211; 365/201; 365/189.09; 365/72

(58) Field of Classification Search .................. 365/211, 365/201, 203, 189.09, 72
See application file for complete search history.

(56) References Cited

U.S. PATENT DOCUMENTS

| | | | |
|---|---|---|---|
| 5,898,706 A | 4/1999 | Dufresne et al. | |
| 5,956,350 A | 9/1999 | Irrinki et al. | |
| 6,744,651 B2 * | 6/2004 | Tang | 365/33 |
| 7,057,201 B2 * | 6/2006 | Perner | 257/3 |
| 7,580,303 B2 * | 8/2009 | Nishimura et al. | 365/203 |
| 2006/0203430 A1 * | 9/2006 | Pinnow et al. | 361/528 |

* cited by examiner

*Primary Examiner* — Anh Phung
*Assistant Examiner* — Toan Le
(74) *Attorney, Agent, or Firm* — Lee & Hayes, PLLC

(57) ABSTRACT

The present disclosure relates to the heating of memory cells.

25 Claims, 11 Drawing Sheets

MEMORY CELL HEATING ELEMENTS

BACKGROUND

Memory cells utilized for certain applications, such as automotive and space applications, may be tested for obvious defects of non-functional structures, as well as latent defects, that are associated with functional, but unstable structures (e.g. a poorly formed contact). In some instances, specialized equipment may be used to externally expose these memory cells to extreme temperatures to identify defects. The equipment that exposes the memory cells to extreme external temperatures is expensive and can take a long time to heat or freeze a circuit using the specialized equipment.

In other instances, memory cells are tested via internal heating of the memory cells. For example, memory cells may be operated at high frequencies. However, with this technique the heating of the memory cells occurs mainly at the input/output region and the actual memory cells are not heated to a substantial degree. In another example, the memory cells may be adjacent to a heating element, such as a resistor. An array of memory cells is not heated uniformly using this technique. In still another example, memory cells may be internally heated using bitlines that have been added to serve as heating elements. The addition of bitlines to an electronic memory array may be costly in the amount of area needed on a memory chip to accommodate the number of additional bitlines needed to achieve uniform heating of the array to a specified testing temperature.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

This disclosure includes techniques to internally heat memory cells for testing purposes. In particular, bitlines and wordlines coupled to memory cells can be used to heat an array of memory cells to identify defects associated with the memory cells of the array. For example, current may be provided to bitlines coupled to inactive memory cells to increase the temperature of the memory cells of the array. In another example, current may be provided to wordlines coupled to inactive memory cells to heat memory cells of the array. Further, current may be provided to bitlines coupled to active memory cells to increase the temperature of memory cells of the array. In some embodiments, the heating of the bitlines and wordlines may take place via heating elements attached to the bitlines and wordlines. The heating of an array of memory cells via the bitlines and the wordlines coupled to the memory cells of the array provides a uniform temperature increase of the memory cells of the array, while minimizing the area on a memory chip covered by the array. In addition, expensive testing equipment is not needed in order to test the memory cells to identify defects.

Figure 1:
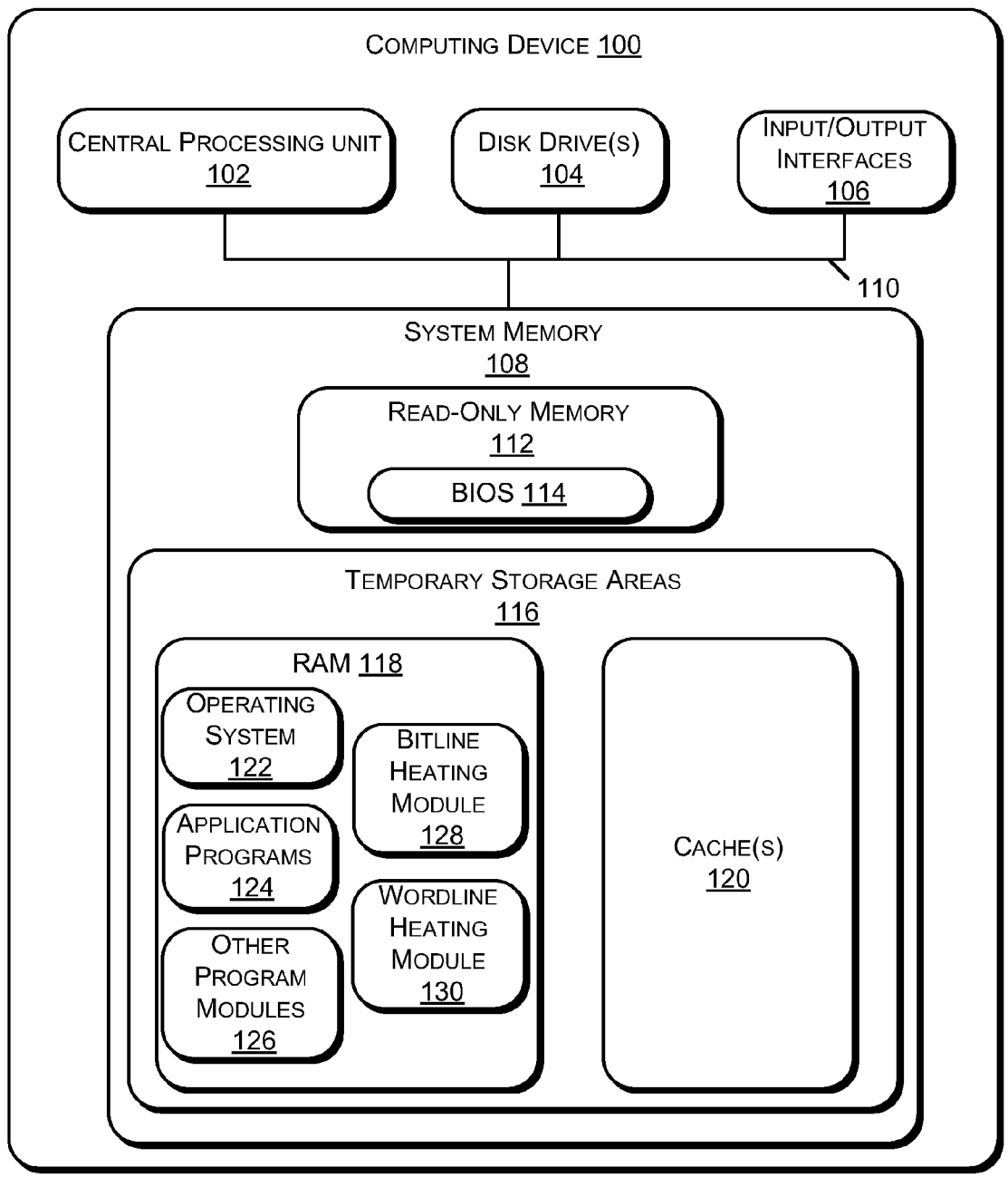
FIG. 1 is a schematic diagram of a computing device utilizing integrated heating of bitlines and wordlines for testing memory cells.

FIG. 1 is a schematic diagram of a computing device 100 utilizing integrated heating of bitlines and wordlines for testing memory cells. The computing device 100 may be a personal computer, a server, a laptop computer, a wireless communication device, such as a mobile handset or a smart phone, a personal digital assistant, or a combination thereof. The computing device 100 includes a central processing unit 102 and one or more disk drives 104. The central processing unit 102 may include one or more processors. The one or more disk drives 104 may include one or more hard disk drives, one or more optical disk drives, or a combination thereof. The computing device 100 also includes input/output interfaces 106. The input/output interfaces 106 facilitate communications between the computing device 100 and a number of input/output devices coupled to the computing device 100, such as a keyboard, a pointing device (e.g. mouse), a display, audio speakers, a microphone, a number of peripheral devices (e.g. printers, scanners), or a combination thereof. The input/output interfaces 106 may also provide access to data stored on a number of removable electronic storage devices, such as an optical disk (e.g. compact disc, digital video disc), a flash memory stick, or other suitable device. Further, the computing device 100 includes a system memory 108. The central processing unit 102, the one or more disk drives 104, the input/output interfaces 106, and the system memory 108 are coupled to each other by a communication bus 110.

The system memory 108 includes read-only memory (ROM) 112. The read-only memory 112 includes a basic input/output system (BIOS) 114 for controlling the low-level operation of the computing device 100. The ROM 112 may be comprised of one or more read-only memory technologies, such as flash memory, erasable programmable read-only memory (EPROM), electrically erasable programmable read-only memory (EEPROM), other read-only memories, or a combination thereof. The system memory 108 further includes temporary storage areas 116. The temporary storage areas 116 may include random access memory (RAM) 118 and one or more caches 120. The RAM 118 and the one or more caches 120 may be comprised of memory cells associated with a number of memory technologies, such as static random access memory (SRAM), dynamic random access memory (DRAM), other types of random access memory, or a combination thereof. The memory cells of the temporary storage areas 116 may be arranged in one or more arrays comprising a number of rows of memory cells and a number of columns of memory cells. Each column of memory cells may be coupled to one or more bitlines and each row of memory cells may be coupled to at least one wordline. Data stored in the memory cells of the one or more arrays may be accessed by activating columns of bitlines coupled to the memory cells and activating rows of wordlines coupled to the memory cells. The bitlines and wordlines may be activated by providing current to the bitlines and wordlines.

The temporary storage areas 116 include an operating system 122, application programs 124, and other program modules 126. The operating system 122 is configured to store and access data with respect to memory cells of the temporary storage areas 116. For example, the operating system 122 may initiate a write access to store data in a number of memory cells of the one or more caches 120 in response to commands received from one of the application programs 124 and/or one of the other program modules 126. In another example, the operating system 122 may initiate a read access to retrieve data stored in the one or more caches 120 in response to requests received from one of the application programs 124 and/or one of the other program modules 126.

The RAM 118 also includes a bitline heating module 128 and a wordline heating module 130. The bitline heating module 128 is configured to increase the temperature of memory cells for testing purposes by providing current to the bitlines coupled to the memory cells. The current may be provided to the bitlines during accesses to data stored at the memory cells, outside of accesses to data stored at the memory cells, or a combination thereof. The wordline heating module 130 is configured to increase the temperature of memory cells by providing current to the wordlines coupled to the memory cells. Current may be provided to the wordlines outside of accesses to the data stored at the memory cells. The bitline heating module 128 and the wordline heating module 130 may operate independently or together to heat memory cells to specified temperatures for testing purposes to identify defects of the memory cells.

The modules 122-126 may be executable by the central processing unit 102 to implement one or more of the functions of the computing device 100. In one embodiment, each of the modules 122-126 may represent instructions embodied in one or more software programs stored in the RAM 118. In another embodiment, the modules 122-126 can represent hardware, software instructions, or a combination thereof. Additionally, although the modules 122-126 are shown residing in the RAM 118, the modules 122-126 may also reside in the one or more disk drives 104 and may be subsequently loaded into the RAM 118.

Figure 2:
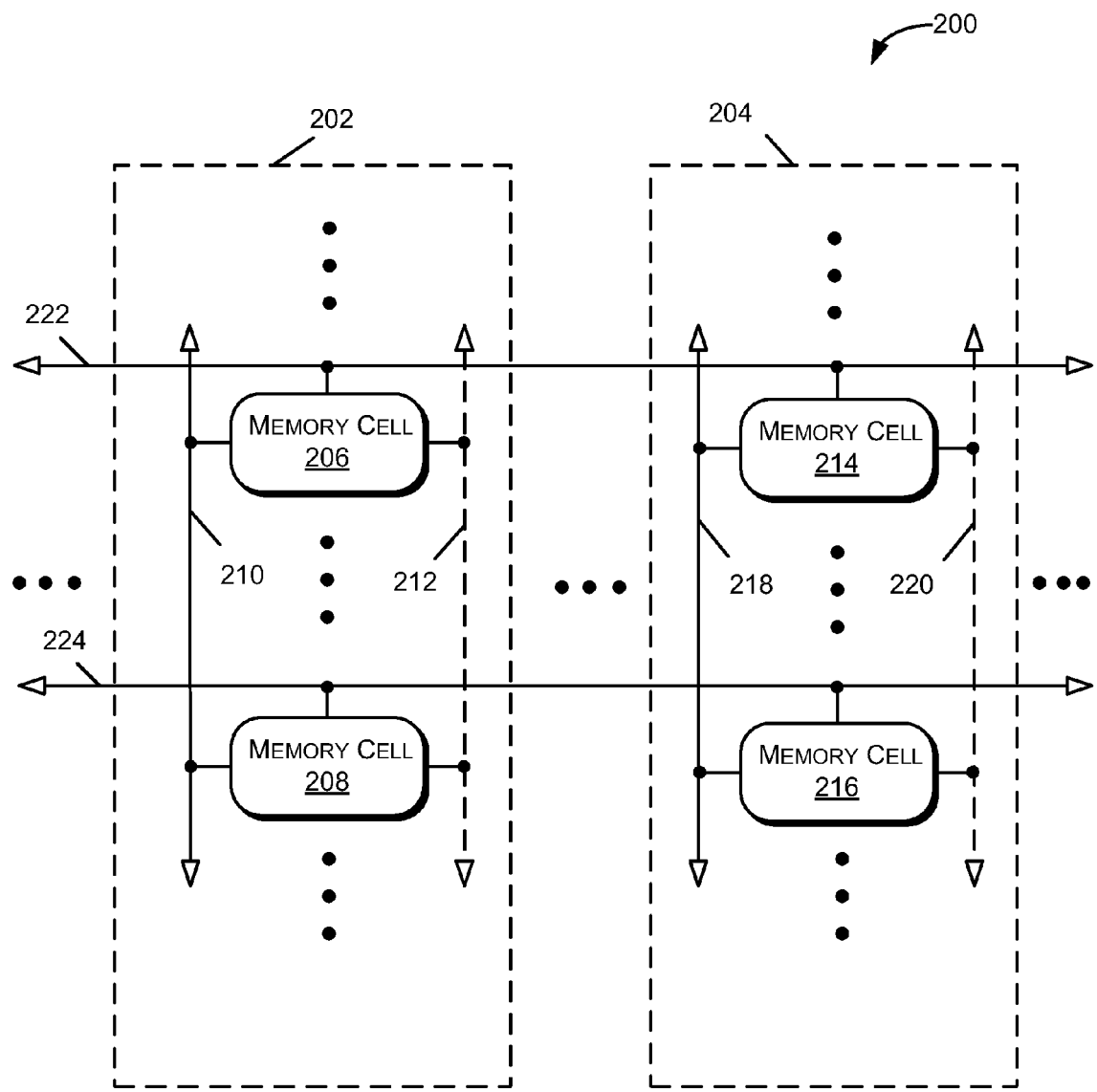
FIG. 2 is a schematic diagram of an array of memory cells including a plurality of wordlines and a plurality of bitlines coupled to the memory cells of the array.

FIG. 2 is a schematic diagram of an array of memory cells 200 including a plurality of wordlines and a plurality of bitlines coupled to memory cells of the array 200. Defects of the array of memory cells 200 may be identified by increasing the temperature of the array 200, which may be accomplished by providing current to the plurality of bitlines and the plurality of wordlines.

The array 200 of memory cells includes a first column 202 of memory cells and a second column 204 of memory cells. The array 200 may include a number of columns of memory cells preceding the first column 202, a number of columns of memory cells after the second column 204, a number of columns of memory cells between the first column 202 and the second column 204, or any combination thereof. The array 200 of memory cells may include memory cells utilizing one or more memory technologies. For example, the array 200 of memory cells may include static random access memory (SRAM) cells, dynamic random access memory (DRAM) cells, other random access memory cells, flash memory cells, erasable programmable read-only memory (EPROM) cells, electrically erasable programmable read-only memory (EEPROM), other read-only memory cells, or a combination thereof.

The first column 202 of memory cells includes a plurality of memory cells, such as a first memory cell 206 and a second memory cell 208. The first column 202 may include a number of additional memory cells preceding the first memory cell 206, a number of memory cells after the second memory cell 208, a number of memory cells between the first memory cell 206 and the second memory cell 208, or a combination thereof. The first column 202 of memory cells also includes one or more bitlines, such as a first bitline 210 and a second bitline 212, coupled to each of the plurality of memory cells of the first column 202. The second bitline 212 is shown as a dashed line because some of the memory cells may require a connection to one bitline, such as DRAM cells, while other memory cells require a connection to two bitlines, such as SRAM cells. Thus, in some embodiments, the second bitline 212 may not be present in the first column 202 of memory cells. Further, the first column 202 of memory cells may also include other components not shown in FIG. 2, such as a precharge circuit and a sense amplifier. A precharge circuit and sense amplifier may be used to read and write data associated with the memory cells of the first column 202.

The second column 204 of memory cells includes a plurality of memory cells, such as a third memory cell 214 and a fourth memory cell 216. The second column 204 may include a number of additional memory cells preceding the third memory cell 214, a number of memory cells after the fourth memory cell 216, a number of memory cells between the third memory cell 214 and the fourth memory cell 216, or a combination thereof. The second column 204 of memory cells also includes one or more bitlines, such as a third bitline 218 and a fourth bitline 220, coupled to each of the plurality of memory cells of the second column of memory cells 204. In some embodiments, and as with second bitline 212, the fourth bitline 220 may not be present in the second column of memory cells 204.

The array 200 of memory cells may also include a first wordline 222 and a second wordline 224. The array 200 may include a number of additional rows of wordlines preceding the first wordline 222, a number of additional rows of wordlines between the first wordline 222 and the second wordline 224, a number of additional rows of wordlines after the second wordline 224, or a combination thereof. The first wordline 222 may be coupled to memory cells of the first column 202 and the second column 204, such as the first memory cell 206 and the third memory cell 214. Additionally, the second wordline 224 may be coupled to memory cells of the first column 202 and the second column 204, such as the second memory cell 208 and the fourth memory cell 216. The first wordline 222 and the second wordline 224 may also be coupled to memory cells of additional columns of the array 200 that are not shown in FIG. 2.

A number of memory cells of the array 200 may store data that is accessible to one or more applications of a computing device, such as the application programs 124 and the other program modules 126 of the computing device 100 of FIG. 1. In some instances, data may be written to memory cells of the array 200, while in other instances, data may be read from memory cells of the array 200.

In one example, with respect to memory technologies having memory cells coupled to two bitlines (e.g. SRAM), a write access to the first memory cell 206 involves providing a precharge current to the first bitline 210 or the second bitline 212. To illustrate, when writing a 0 to the first memory cell 206, the second bitline 212 receives a precharge current to a logical 1, represented as the positive supply voltage, $V_{DD}$, and a voltage of the first bitline 210 is set to a logical 0, represented as the ground voltage or negative supply voltage, $V_{SS}$. After providing the precharge current, the first wordline 222 is activated by providing a current to the first wordline 222. During this write access, the memory cells coupled to the first wordline 222 are considered to be active memory cells. Once the first wordline 222 is activated, the components of the memory cell 206 are activated by the voltage of the first bitline 210 and the voltage of the second bitline 212 and the first memory cell 206 changes state to represent a 0.

In another example, with respect to memory technologies having memory cells coupled to two bitlines, a read access to the first memory cell 206 involves providing a precharge current to both the first bitline 210 and the second bitline 212 until the first wordline 222 is activated. In this example, once the first wordline 222 is activated, one of the bitlines 210, 212 is pulled to a voltage representing a logical 1 and the other of the bitlines 210, 212 is pulled to a voltage representing a logical 0, depending on the contents of the first memory cell 206.

In a further example, with respect to memory technologies having memory cells coupled to one bitline (e.g. DRAM), during a read access of the first memory cell 206, the first bitline 210 receives a precharge current until the first wordline 222 is activated. When the first wordline 222 is activated, the components of the first memory cell 206 receive the voltage of the first bitline 210 and the data stored at the first memory cell 206 is identified by a sense amplifier coupled to the first bitline 210.

Bitlines and wordlines coupled to inactive memory cells of the memory cell array 200 may be used to test for defects of the array 200 by increasing the temperature of the array 200. A memory cell of the array 200 may be considered inactive when a wordline coupled to the memory cell is not to be activated in order to access data stored at the memory cell. In an illustrative embodiment, the second memory cell 208 may store data that is not being accessed by an application of a computing device at a particular time. During the inactive state of the second memory cell 208, current may be provided to the first bitline 210 and/or the second bitline 212. For example, a precharge circuit may provide current to the first bitline 210 and/or the second bitline 212 for a specified period of time, such as the period of time between read or write operations of the second memory cell 208. In this way, heat is produced by the flow of current through the respective bitline(s) and the temperature of the array 200 increases. Further, the data stored at the second memory cell 208 is not disturbed because the voltages of the first bitline 210 and/or the second bitline 212 are only provided to the components of the second memory cell 208 in response to activating the second wordline 224.

Additionally, current may be provided to the wordlines 222, 224 coupled to inactive memory cells of the memory cell array 200. In some embodiments, the current provided to the wordlines 222, 224 is limited to a threshold voltage to prevent activation of the bitlines 210, 212, 218, or 220, which may result in corruption of data stored in memory cells of the array 200.

In an additional illustrative embodiment, a number of memory cells of the array 200 may be dedicated to heating the array 200 and not used for the storage of data. For example, the second column 204 may include memory cells dedicated to heating the array 200. In some embodiments, data may be prevented from being written to the cells of the second column 204 by de-coupling the bitlines 218, 220 from the wordlines 222, 224. In other embodiments, data may be prevented from being written to the cells of the second column 204 by providing instructions to the operating system of a computing device including the array 200 indicating that data is not to be written to the cells of the second column of memory cells 204.

By applying current to bitlines and wordlines coupled to inactive memory cells, the temperature of the array of memory cells 200 may increase and defects of the array 200 may be identified as the temperature increases. The use of existing bitlines and wordlines to heat the array 200 provides uniform heating of the array 200 without adding further components to the array 200 and thus, minimizes the area of a memory chip including the array 200. Additionally, memory cells in the array 200 that are not used to store data may be used to increase the temperature of the array because these memory cells will not be associated with read accesses or write accesses. Thus, the array 200 may be heated more quickly and to higher temperatures and the time needed to test the memory cells of the array 200 may be reduced.

Figure 3:
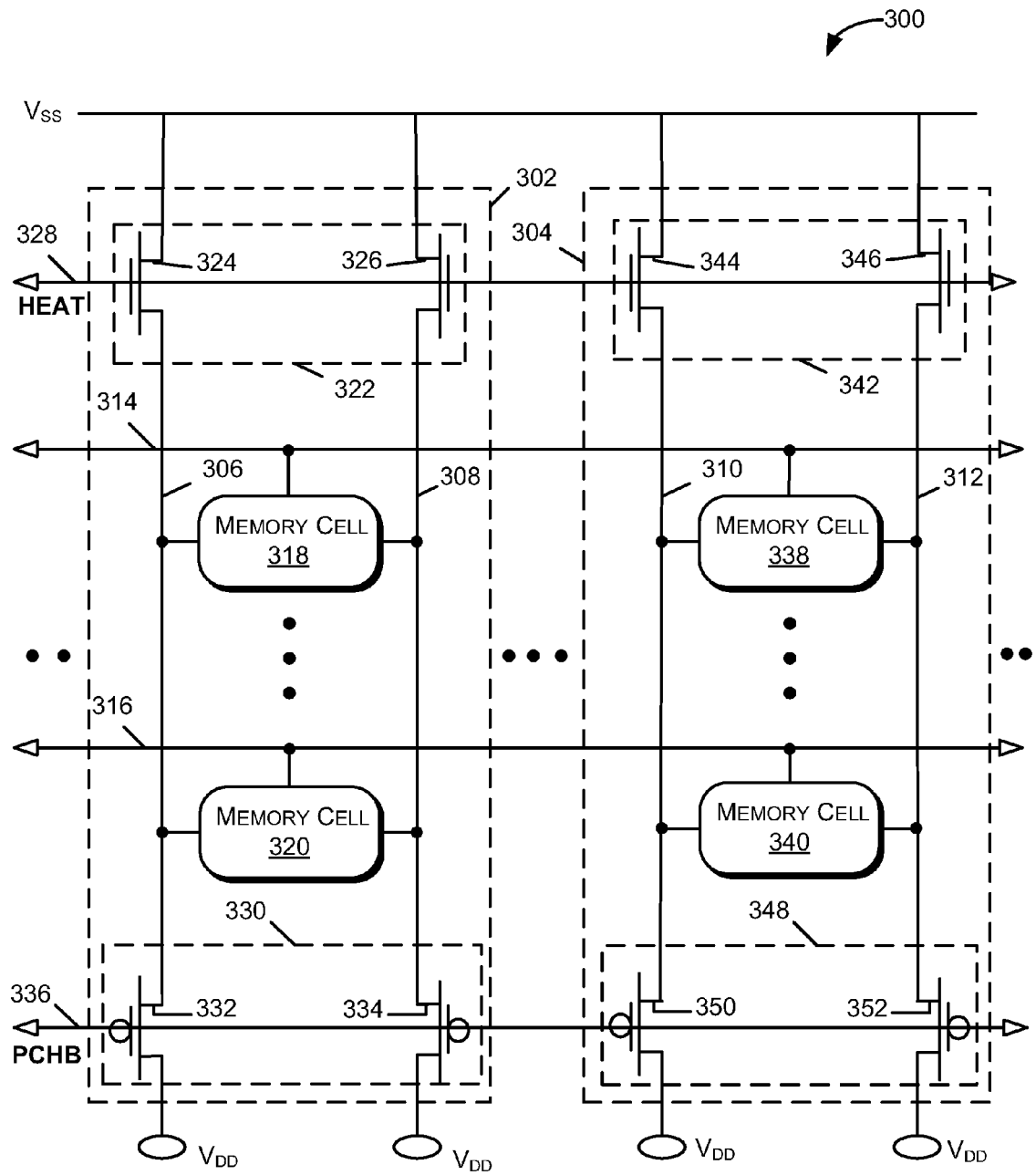
FIG. 3 is a schematic diagram of an array of memory cells including memory cell heating elements and including pre-charge circuits coupled to bitlines of the array.

FIG. 3 is a schematic diagram of an array 300 of memory cells including memory cell heating elements and including precharge circuits coupled to bitlines of the array of memory cells 300. The array of memory cells 300 includes a first column 302 of memory cells and a second column 304 of memory cells. The array 300 may include a number of columns of memory cells preceding the first column 302, a number of columns of memory cells after the second column 304, a number of columns of memory cells between the first column 302 and the second column 304, or a combination thereof. The array 300 of memory cells also includes a first bitline 306, a second bitline 308, a third bitline 310, and a fourth bitline 312. Further, the array 300 of memory cells includes a first wordline 314 and a second wordline 316. Current may be provided to the bitlines 306-312 to increase the temperature of the array 300 for testing purposes to identify defects of the array 300.

The first column 302 of memory cells includes a first memory cell 318 and a second memory cell 320. The first column 302 of memory cells may include a number of additional memory cells between the first memory cell 318 and the second memory cell 320. The first memory cell 318 and the second memory cell 320 are coupled to the first bitline 306 and to the second bitline 308. Further, the first memory cell 318 is coupled to the first wordline 314 and the second memory cell 320 is coupled to the second wordline 316.

In addition, the first column 302 of memory cells includes a first memory cell heating element 322. The first heating element 322 may include a first negative channel metal oxide semiconductor (NMOS) transistor 324 and a second NMOS transistor 326. The sources of the first and second NMOS transistors 324 and 326 are coupled to a negative supply voltage, $V_{SS}$. The first heating element 322 may receive a control signal, HEAT, via a line 328. In particular, the line 328 is coupled to a gate of the first NMOS transistor 324 and to the gate of the second NMOS transistor 326. The control signal, HEAT, may be provided to the first heating element 322 to produce current flow in the first bitline 306, the second bitline 308, or a combination thereof, to increase the temperature of the array 300 for testing purposes. A drain of the first NMOS transistor 324 is coupled to the memory cells of the first column 302 of memory cells via the first bitline 306 and a drain of the second NMOS transistor 326 is coupled to the memory cells of the first column 302 via the second bitline 308.

The first column 302 of memory cells also includes a first precharge circuit 330. The first precharge circuit 330 includes a first positive channel metal oxide semiconductor (PMOS) transistor 332 and a second PMOS transistor 334. A drain of the first PMOS transistor 332 is coupled to the memory cells of the first column 302 of memory cells via the first bitline 306 and a drain of the second PMOS transistor 334 is coupled to the memory cells of the first column 302 via the second bitline 308. A source of the first PMOS transistor 332 is coupled to a positive supply voltage, $V_{DD}$, and a source of the second PMOS transistor 334 is also coupled to the positive supply voltage, $V_{DD}$. Additionally, the precharge circuit 330 receives a control signal, PCHB, via a line 336. In particular, a gate of the first PMOS transistor 332 is coupled to the line 336 and a gate of the second PMOS transistor 334 is coupled to the line 336. The control signal, PCHB, activates the first PMOS transistor 332, the second PMOS transistor 334, or a combination thereof, to provide current to the first bitline 306 and/or the second bitline 308.

The second column 304 of memory cells includes a third memory cell 338 and a fourth memory cell 340. The second column 304 may include a number of additional memory cells between the third memory cell 338 and the fourth memory cell 340. The third memory cell 338 and the fourth memory cell 340 are coupled to the third bitline 310 and to the fourth bitline 312. Further, the third memory cell 338 is coupled to the first wordline 314 and the fourth memory cell 340 is coupled to the second wordline 316.

In addition, the second column 304 of memory cells includes a second memory cell heating element 342. The second heating element 342 may include a third NMOS transistor 344 and a fourth NMOS transistor 346. The sources of the third and fourth NMOS transistors 344 and 346 are coupled to the negative supply voltage, $V_{SS}$. The second heating element 342 may receive a control signal, HEAT, via the line 328. In particular, the line 328 is coupled to a gate of the third NMOS transistor 344 and to the gate of the fourth NMOS transistor 346. The control signal, HEAT, may be provided to the second heating element 342 to produce current flow in the third bitline 310, the fourth bitline 312, or a combination thereof, to increase the temperature of the array 300 for testing purposes. A drain of the third NMOS transistor 344 is coupled to the memory cells of the second column 304 of memory cells via the third bitline 310 and a drain of the fourth NMOS transistor 346 is coupled to the memory cells of the second column 304 via the fourth bitline 312.

The second column 304 of memory cells also includes a second precharge circuit 348. The second precharge circuit 348 includes a third PMOS transistor 350 and a fourth PMOS transistor 352. A drain of the third PMOS transistor 350 is coupled to the memory cells of the second column 304 of memory cells via the third bitline 310 and a drain of the fourth PMOS transistor 352 is coupled to the memory cells of the second column 304 via the fourth bitline 312. A source of the third PMOS transistor 350 is coupled to the positive supply voltage, $V_{DD}$, and a source of the fourth PMOS transistor 352 is also coupled to the positive supply voltage, $V_{DD}$. Additionally, the second precharge circuit 348 receives a control signal, PCHB, via the line 336. In particular, a gate of the third PMOS transistor 350 is coupled to the line 336 and a gate of the fourth PMOS transistor 352 is coupled to the line 336. The control signal, PCHB, activates the third PMOS transistor 350, the fourth PMOS transistor 352, or a combination thereof, to provide current to the third bitline 310 and/or the fourth bitline 312.

In some instances, current may be provided to the first bitline 306 and/or the second bitline 308 to increase the temperature of the array 300 of memory cells. In an illustrative embodiment, current may be provided to the first bitline 306 and/or the second bitline 308 outside of accesses to data stored in the memory cells of the first column 302 of memory cells. That is, a heating current may be provided to the first bitline 306, the second bitline 308, or a combination thereof, when data stored at the memory cells of the first column 302 is not being accessed via a read access or a write access. For example, outside of access to the data of the first memory cell 318, the first wordline 314 is inactive, thus the first bitline 306 and the second bitline 308 are isolated from the first memory cell 318. In this example, the control signal HEAT may be provided to the first NMOS transistor 324 and the second NMOS transistor 326. Consequently, the first NMOS transistor 324 and the second NMOS transistor 326 provide current to the first bitline 306 and the second bitline 308. The current flowing through the first bitline 306 and the second bitline 308 generates heat that increases the temperature of the array 300 to test for defects of the array 300.

In another illustrative embodiment, current may be provided to the first bitline 306 and/or the second bitline 308 during accesses of data stored in the memory cells of the first column 302 of memory cells to heat the array of memory cells 300 for testing purposes. For example, during a write access of data to the first memory cell 318, a precharge current may be provided to the first bitline 306 or the second bitline 308 via the precharge circuit 330. In particular, the first PMOS transistor 332 or the second PMOS transistor 334 may be activated by the control signal PCHB to provide current to the first bitline 306 or the second bitline 308 depending on the data to be written to the first memory cell 318. After the precharge current is provided to the first bitline 306 or the second bitline 308, the first wordline 314 is activated and the data is written to the memory cell 318 because the state of the memory cell 318 changes when exposed to the voltage of the first bitline 306 or the second bitline 308. Subsequently, the memory cell heating element 322 is activated by the control signal HEAT to provide a heating current to the first bitline 306 or the second bitline 308. To illustrate, when a 0 is to be written to the first memory cell 318, the second bitline 308 is precharged to a logical 1 and after the precharge current is no longer provided to the second bitline 308, the second NMOS transistor 326 may be activated by the control signal HEAT to provide a heating current to the second bitline 308. In this way, the temperature of the array of memory cells 300 increases due to the additional current provided to the second bitline 308. In some embodiments, the heating current may be provided to the second bitline 308 until the end of a clock cycle that triggered the write access. In another illustration, when a 1 is written to the first memory cell 318, the first bitline 306 is precharged to a logical 1 and after the precharge current is no longer provided to the first bitline 306, the first NMOS transistor 324 may be activated by the control signal HEAT to provide a heating current to the first bitline 306.

Bitlines coupled to active memory cells that are unselected during an access of another memory cell may also receive heating current to increase the temperature of the array 300 of memory cells. A particular memory cell may be active, but unselected when an access is directed to a memory cell coupled to the same wordline as the particular memory cell, but the data associated with the particular memory cell is not being accessed. For example, when data is written to or read from the first memory cell 318, but not the third memory cell 338, the third memory cell 338 is considered an unselected active memory cell. In this example, when data of the first memory cell 308 is being accessed, a heating current may be provided to the third bitline 310 or the fourth bitline 312. To illustrate, when the third memory cell 338 is storing a 1, the third NMOS transistor 344 may be activated by the control signal HEAT to provide current to the third bitline 310 during the access of the first memory cell 318. In another illustration, when the third memory cell 338 is storing a 0, the fourth NMOS transistor 346 may be activated by the control signal HEAT to provide current to the fourth bitline 312 during the access of the first memory cell 318. In some embodiments, since the first wordline 314 is active during the access of the first memory cell 318, the voltage of the third bitline 310 or the fourth bitline 312 is maintained above a particular threshold (e.g. $V_{DD}$—0.3V) in order to avoid corrupting the data stored at the third memory cell 338, such as by changing the state of the third memory cell 338. In this way, the additional current provided to the third bitline 310 or the fourth bitline 312 during a memory access of the first memory cell 318 increases the temperature of the array 300 of memory cells.

When a particular memory cell of the array 300 is associated with a read access, the bitlines coupled to the particular memory cell are not available to receive a heating current to increase the temperature of the array 300 because the data of the particular memory cell is identified based on a difference between the voltage of a bitline and a complementary bitline coupled to the particular memory cell. For example, data of the first memory cell 318 may be identified in response to a read access based on a difference between the voltage of the first bitline 306 and the voltage of the second bitline 308 (i.e. the complementary bitline). Thus, any additional current, such as a heating current, provided to the first bitline 306 or the second bitline 308 may alter the voltage of the respective bitline and interfere with the identification of the data stored in the first memory cell 318.

By using the first heating element 322 and/or the second heating element 342, a heating current may be provided to the bitlines 306-312 to heat the array of memory cells 300 during memory access and outside of memory access. In this way, heating of the array 300 for testing purposes may be accomplished uniformly throughout the array 300 to identify defects. In addition, the size of the array 300 on a memory chip is minimized with the addition of only the NMOS transistors of the first heating element 322 and the second heating element 342.

Although the array 300 of memory cells shown in FIG. 3 shows a first heating element 322 and a second heating element 342, the array 300 may include fewer heating elements. For example, a heating element may only be coupled to bitlines of every other column of memory cells of the array 300. In addition, although the first heating element 322 and the second heating element 342 are shown in FIG. 3 including NMOS transistors, the transistors 324, 326, 344, 346 may also be PMOS transistors or other activating elements. Further, although the first precharge circuit 330 and the second precharge circuit 348 are shown in FIG. 3 to include PMOS transistors, the precharge circuits 330, 348 may include one or more NMOS transistors. Additionally, although the first column 302 of memory cells and the second column 304 of memory cells are shown in FIG. 3 to include a respective pair of bitlines, the first column 302 may include a single bitline and the second column 304 may include a single bitline. For example, in implementations including memory cells utilizing DRAM or flash memory technologies, the memory cells of the first column 302 may be coupled to a single bitline and/or the memory cells of the second column 304 may be coupled to a single bitline. Consequently, the heating elements 322, 342 and the precharge circuits 330, 348 may include a single activating element, such as a single NMOS transistor or a single PMOS transistor.

Figure 4:
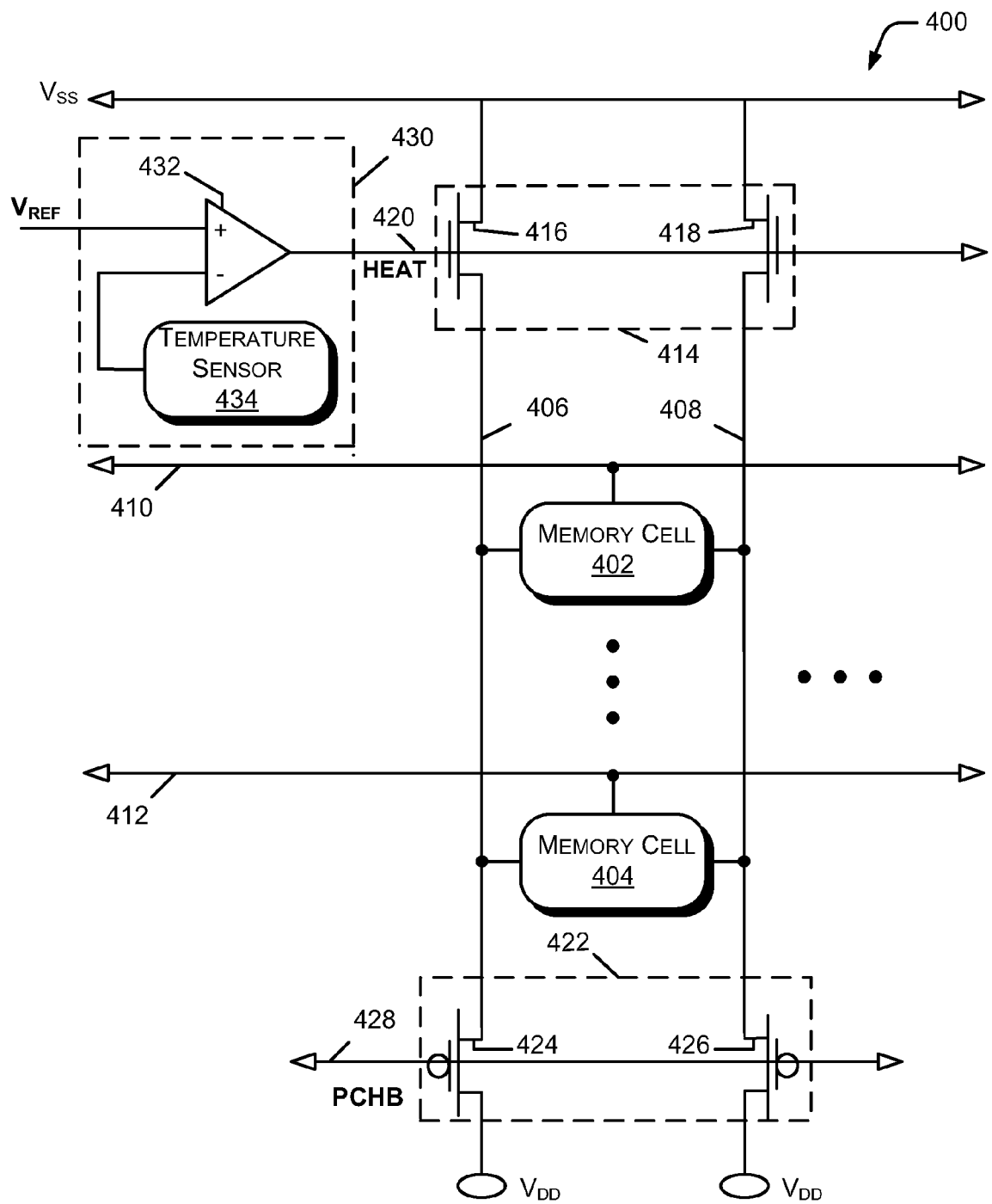
FIG. 4 is a schematic diagram of an array of memory cells including memory cell heating elements and including pre-charge circuits coupled to bitlines of the array, as well as, a temperature controller coupled to at least one of the heating elements.

FIG. 4 is a schematic diagram of an array 400 of memory cells including memory cell heating elements and including precharge circuits, as well as, a temperature controller coupled to at least one of the heating elements. The array 400 of memory cells includes a first memory cell 402 and a second memory cell 404. The array 400 may include a number of additional memory cells between the first memory cell 402 and the second memory cell 404. In addition, the array 400 may include a number of rows and columns of additional memory cells after the first memory cell 402 and the second memory cell 404. The first memory cell 402 and the second memory cell 404 are coupled to a first bitline 406 and to a second bitline 408. Further, the first memory cell 402 is coupled to a first wordline 410 and the second memory cell 404 is coupled to a second wordline 412. The array 400 of memory cells may include a number of additional columns of bitlines and a number of additional rows of wordlines.

In addition, the array 400 of memory cells includes a memory cell heating element 414. The heating element 414 includes a first negative channel metal oxide semiconductor (NMOS) transistor 416 and a second NMOS transistor 418. The sources of the first and second NMOS transistors 416 and 418 are coupled to a negative supply voltage, $V_{SS}$. The first heating element 414 may receive a control signal, HEAT, via a line 420. In particular, the line 420 is coupled to a gate of the first NMOS transistor 416 and to a gate of the second NMOS transistor 418. The control signal HEAT activates the first NMOS transistor 416 and/or the second NMOS transistor 418 of the first heating element 414 to provide a heating current to the first bitline 406, the second bitline 408, or a combination thereof, to increase the temperature of the array 400. A drain of the first NMOS transistor 416 is coupled to the memory cells of the array 400 via the first bitline 406 and a drain of the second NMOS transistor 418 is coupled to the memory cells of the array 400 via the second bitline 408.

The array 400 of memory cells also includes a precharge circuit 422. The precharge circuit 422 includes a first PMOS transistor 424 and a second PMOS transistor 426. A drain of the first PMOS transistor 424 is coupled to the memory cells of the array 400 via the first bitline 406 and a drain of the second PMOS transistor 426 is coupled to the memory cells of the array 400 via the second bitline 408. A source of the first PMOS transistor 424 is coupled to a positive supply voltage, $V_{DD}$, and a source of the second PMOS transistor 426 is also coupled to the positive supply voltage, $V_{DD}$. Additionally, the precharge circuit 422 receives a control signal, PCHB, via a line 428. In particular, a gate of the first PMOS transistor 424 is coupled to the line 428 and a gate of the second PMOS transistor 426 is coupled to the line 428. The control signal PCHB activates the first PMOS transistor 424, the second PMOS transistor 426, or a combination thereof, to provide a precharge current to the first bitline 406 and/or the second bitline 408. The control signal HEAT may be provided to the first heating element 414 by a temperature controller 430. The temperature controller 430 may include a comparator 432 and a temperature sensor 434. A non-inverting input of the comparator 432 may receive a control signal, $V_{REF}$. The control signal $V_{REF}$ may indicate a target temperature of the array 400 expressed in volts. An inverting input of the comparator 432 may receive a signal from the temperature sensor 434. The temperature sensor 434 may provide a signal to the comparator 432 indicating a current temperature of the array 400 expressed in volts. In this way, the comparator 432 may output the control signal HEAT when the current temperature of the array 400 is lower than the target temperature specified by $V_{REF}$. Thus, the first NMOS transistor 416, the second NMOS transistor 418, or a combination thereof, may be activated to provide a heating current into the first bitline 406 and/or the second bitline 408. Further, when the current temperature of the array 400 is higher than the target temperature, the comparator 432 may not provide the control signal HEAT to the heating element 414. Consequently, heating of the array 400 may be controlled, such that the temperature of the array 400 may be increased by providing current to the bitlines 406, 408 until a target temperature is achieved. The temperature controller 430 may provide the control signal HEAT to the heating element 414 during accesses of the memory cells of the array 400, outside of accesses of the memory cells of the array 400, or a combination thereof, as described above with respect to FIG. 3.

Figure 5:
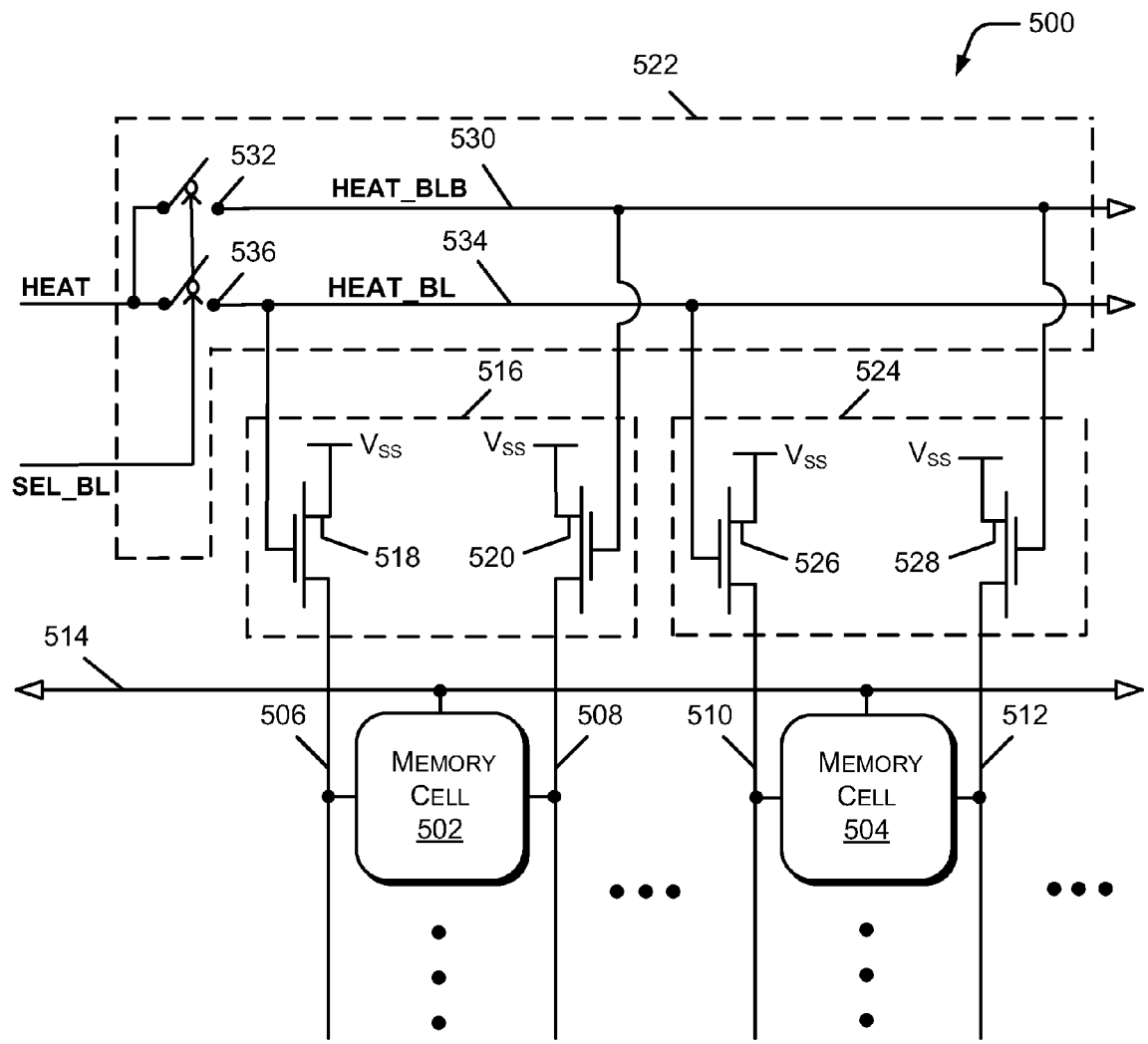
FIG. 5 is a schematic diagram of an array of memory cells, where each memory cell is coupled to a bitline and a complementary bitline and the bitlines and complementary bitlines are coupled to a respective switching arrangement.

FIG. 5 is a schematic diagram of an array 500 of memory cells, where each memory cell is coupled to a respective bitline and a respective complementary bitline and the respective bitlines and respective complementary bitlines are coupled to one or more switching arrangements. The array 500 of memory cells includes a first memory cell 502 and a second memory cell 504. The first memory cell 502 is coupled to a first bitline 506 and a second bitline 508. The second memory cell 504 is coupled to a third bitline 510 and a fourth bitline 512. In addition, the first memory cell 504 and the second memory cell 506 are coupled to a wordline 514. The array of memory cells 500 may include a number of additional rows of memory cells below the first memory cell 502 and the second memory cell 504. Additionally, the array 500 may include a number of additional columns of memory cells between the first memory cell 502 and the second memory cell 504, a number of additional columns after the second memory cell 504, or a combination thereof. Further, the array 500 may include a number of additional columns of bitlines and a number of additional rows of wordlines.

The array 500 also includes a first memory cell heating element 516. The first heating element 516 includes a first NMOS transistor 518 and a second NMOS transistor 520. The sources of the first and second NMOS transistors 518 and 520 are coupled to a negative supply voltage, $V_{SS}$. A drain of the first NMOS transistor 518 is coupled to memory cells of the array 500, including the first memory cell 502, via the first bitline 506 and a drain of the second NMOS transistor 518 is coupled to memory cells of the array 500 via the second bitline 508. Further, a gate of the first NMOS transistor 518 is coupled to a switching arrangement 522 and a gate of the second NMOS transistor 520 is also coupled to the switching arrangement 522.

The array 500 of memory cells also includes a second memory cell heating element 524. The second heating element 524 includes a third NMOS transistor 526 and a fourth NMOS transistor 528. The sources of the third and fourth NMOS transistors 526 and 528 are coupled to the negative supply voltage, $V_{SS}$. A drain of the third NMOS transistor 526 is coupled to memory cells of the array 500, including the second memory cell 504, via the third bitline 510 and a drain of the fourth NMOS transistor 528 is coupled to the memory cells of the array 500 via the fourth bitline 512. Further, a gate of the third NMOS transistor 526 is coupled to the switching arrangement 522 and a gate of the fourth NMOS transistor 528 is coupled to the switching arrangement 522.

The switching arrangement 522 includes a first line 530 coupled to a first switch 532 and a second line 534 coupled to a second switch 536. The first line 530 is also coupled to the gate of the second NMOS transistor 520 and the gate of the fourth NMOS transistor 528 and the second line 534 is coupled to the gate of the first NMOS transistor 518 and the gate of the third NMOS transistor 526. The switching arrangement 522 receives a control signal, HEAT, and a control signal, SEL_BL. A representation of the control signal HEAT may be provided to the first NMOS transistor 518 and the third NMOS transistor 526 as the control signal HEAT_BL. In addition, a representation of the control signal HEAT may be provided to the second NMOS transistor 520 and the fourth NMOS transistor 528 as the control signal HEAT_BLB.

In an illustrative embodiment, the control signal SEL_BL may be provided to the switching arrangement 522 to operate the first switch 532 and the second switch 536. For example, when the first bitline 506 and the third bitline 510 are to be used to increase the temperature of the array 500 of memory cells, such as during a write access that involves providing a precharge current to the first bitline 506 and/or the third bitline 510 or when memory cells of the array 500 are inactive, the control signal SEL_BL may activate the second switch 536 to close and provide the control signal HEAT_BL to the first NMOS transistor 518 and the third NMOS transistor 526. In this way, the first NMOS transistor 518 and the third NMOS transistor 526 are activated to provide a heating current to the first bitline 506 and the third bitline 510 to increase the temperature of the array 500. In another example, when the second bitline 508 and the fourth bitline 512 are to be used to increase the temperature of the array of memory cells 500, the control signal SEL_BL may activate the first switch 532 to close and provide the control signal HEAT_BLB to the second NMOS transistor 520 and the fourth NMOS transistor 528. In this way, the second NMOS transistor 520 and the fourth NMOS transistor 528 are activated to provide a heating current to the second bitline 508 and the fourth bitline 512 to increase the temperature of the array. In a further example, each of the bitlines 506-512 may be used to increase the temperature of the array 500. In this example, the control signal SEL_BL may activate the second switch 536 and the first switch 532 to close and provide the control signal HEAT_BL to the first NMOS transistor 518 and the third NMOS transistor 526 and to provide the control signal HEAT_ BLB to the second NMOS transistor 520 and the fourth NMOS transistor 528. Consequently, the first NMOS transistor 518, the second NMOS transistor 520, the third NMOS transistor 526, and the fourth NMOS transistor 528 may be activated to provide a heating current to the first bitline 506, the second bitline 508, the third bitline 510, and the fourth bitline 512, respectively, to heat the array 500 for testing purposes. When the first heating element 516 and the second heating element 524 are not to be used to increase the temperature of the array 500, such as during read accesses of memory cells of the array 500, the control signal SEL_BL may open the first switch 532 and the second switch 536, so that an inactive control signal is provided to the first heating element 516 or the second heating element 524.

Figure 6:
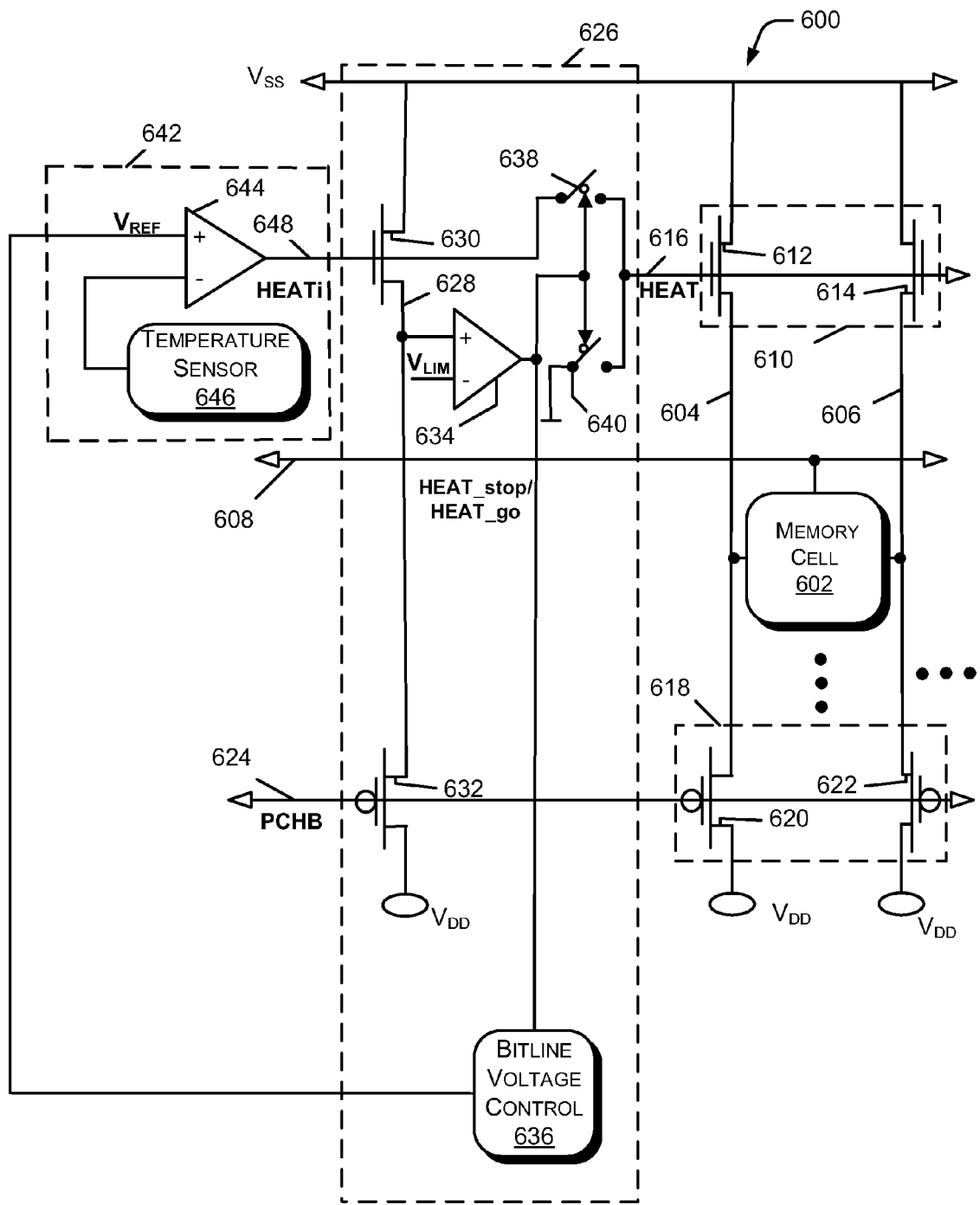
FIG. 6 is a schematic diagram of an array of memory cells including a bitline voltage control arrangement and a temperature controller.

FIG. 6 is a schematic diagram of an array 600 of memory cells including a bitline voltage control arrangement and a temperature controller. The array 600 includes a memory cell 602. The array 600 may include a number of rows and columns of memory cells adjacent to the memory cell 602. The array 600 also includes a first bitline 604 and a second bitline 606. The first bitline 604 is coupled to a number of memory cells, such as the memory cell 602 and the second bitline 606 is coupled to a number of memory cells, such as the memory cell 602. The array 600 may include a number of additional columns of bitlines coupled to additional columns of memory cells of the array 600. In addition, the array 600 includes a wordline 608 coupled to the memory cell 602. The array 600 may include a number of additional rows of wordlines coupled to additional rows of memory cells of the array 600.

The array 600 also includes a memory cell heating element 610. The heating element 610 includes a first NMOS transistor 612 and a second NMOS transistor 614. The sources of the first and second NMOS transistors 612 and 614 are coupled to a negative supply voltage, $V_{SS}$. A drain of the first NMOS transistor 612 is coupled to a number of memory cells of the array 600, including the memory cell 602 via the first bitline 604. In addition, a drain of the second NMOS transistor 614 is coupled to a number of memory cells of the array 600 via the second bitline 606. A gate of the first NMOS transistor 612 may receive a control signal, HEAT, via a line 616 and a gate of the second NMOS transistor 614 may also receive the control signal, HEAT, via the line 616.

Further, the array 600 of memory cells includes a precharge circuit 618. The precharge circuit 618 provides a precharge current to the first bitline 604 and the second bitline 606 during an access of contents stored at the memory cells coupled to the first bitline 604 and the second bitline 606. The precharge circuit 618 includes a first PMOS transistor 620 and a second PMOS transistor 622. A drain of the first PMOS transistor 620 is coupled to a number of memory cells of the array 600, including the memory cell 602, via the first bitline 604. Additionally, a drain of the second PMOS transistor 622 is coupled to a number of memory cells of the array 600 via the second bitline 606. A source of the first PMOS transistor 620 is coupled to a positive supply voltage, $V_{DD}$, and a source of the second PMOS transistor 622 is also coupled to the positive supply voltage, $V_{DD}$. A gate of the first PMOS transistor 620 receives a control signal, PCHB, via a line 624 and a gate of the second PMOS transistor 622 receives the control signal, PCHB, via the line 624. The control signal PCHB activates the first PMOS transistor 620, the second PMOS transistor 622, or a combination thereof, to provide a precharge current to the first bitline 604 and/or the second bitline 606.

The array 600 of memory cells includes a bitline voltage control arrangement 626. The bitline voltage control arrangement 626 is configured to estimate a voltage of the bitlines of the array 600, such as the first bitline 604 and the second bitline 606. The bitline voltage control arrangement 626 includes a dummy bitline 628 and a third NMOS transistor 630. The third NMOS transistor 630 serves as a heating element for the dummy bitline 628. A source of the third NMOS transistor 630 is coupled to the negative supply voltage, $V_{SS}$. A drain of the third NMOS transistor 630 is coupled to a drain of a third PMOS transistor 632 via the dummy bitline 628. A source of the third PMOS transistor 632 is coupled to a positive supply voltage, $V_{DD}$. A gate of the third PMOS transistor 632 receives the control signal PCHB, via the line 624. The third PMOS transistor 632 functions as a precharge circuit for the dummy bitline 628.

The bitline voltage control arrangement 626 also includes a comparator 634. An inverting input of the comparator 634 receives the control signal, $V_{LIM}$. The control signal $V_{LIM}$ represents a voltage threshold for the bitlines of the array 600. For example, a voltage of the bitlines coupled to unselected, but active memory cells of the array 600, should be kept below a specified threshold (e.g. $V_{DD}$—0.3V) to prevent corruption of data stored at these memory cells. A non-inverting input of the comparator 634 receives a signal indicating the voltage of the dummy bitline 628. In this way, the comparator 634 can determine whether the voltage of the dummy bitline 628 is above the threshold voltage $V_{LIM}$.

The comparator 634 may provide an output signal, HEAT_stop to a bitline voltage controller 636 of the bitline voltage control arrangement 626 when the voltage of the dummy bitline 628 is above the threshold voltage $V_{LIM}$. In addition, the comparator 634 may provide the output control signal, HEAT_stop, to a first switch 638 of the bitline voltage control arrangement 626 and/or to a second switch 640 of the bitline voltage control arrangement 626 when the voltage of the dummy bitline 628 is larger than the threshold voltage. For example, the HEAT_stop signal may activate the first switch 638 to open and the second switch 640 to close in order to stop the control signal HEAT from being provided to the heating element 610. The control signal HEAT is a representation of the HEATi control signal provided to heating elements following the first switch 638. Further, in response to receiving the HEAT_stop signal, the bitline voltage controller 636 may send a signal to a temperature controller 642 to change a target temperature to a lower temperature.

When the voltage of the dummy bitline 628 is less than the threshold voltage, the comparator 634 may send an additional output control signal, HEAT_go, to activate the first switch 638 to close and the second switch 640 to open in order to provide the HEAT signal to the heating element 610 via the line 616. In this way, the control signal HEAT causes the heating element 610 to provide a heating current to the first bitline 604 and the second bitline 606 to increase the temperature of the array 600. The HEAT_go signal may also cause the bitline voltage controller 636 to send a signal to the temperature controller 642 to increase the target temperature or to maintain the target temperature at the current temperature.

The temperature controller 642 includes a comparator 644. An inverting input of the comparator 644 receives a signal from a temperature sensor 646. The temperature sensor 646 may provide a signal to the comparator 644 based on a measurement of the temperature of the array 600. A non-inverting input of the comparator 644 is a control signal $V_{REF}$. The $V_{REF}$ control signal is received from the bitline voltage controller 636. The $V_{REF}$ signal indicates a target temperature expressed in volts. Thus, the comparator 644 provides an output signal HEATi via the line 646 to the third NMOS transistor 630 and to the first switch 638 until the temperature of the array 600 reaches the temperature indicated by the control signal $V_{REF}$. The HEATi control signal activates the third NMOS transistor 630 to provide a heating current to the dummy bitline 628.

In some embodiments, the components of the bitline voltage control arrangement 626 may be sized differently than the other components of the array of memory cells 600. For example, the dummy bitline 628 may be larger in size than the first bitline 604 and the second bitline 606. Further, the third NMOS transistor 630 may be larger in size than the first NMOS transistor 612 and the second NMOS transistor 614. Consequently, when the components of the bitline voltage control arrangement 628 are sized larger than other corresponding components of the array 600, the voltage of the dummy bitline 628 may exceed the threshold voltage before the first bitline 604 and the second bitline 606. Thus, the control signal HEAT will stop being provided to the heating element 610 before the voltage of the first bitline 604 and the second bitline 606 exceed the threshold voltage. The sizing of the components of the bitline voltage control arrangement 626 provides an additional safeguard against exceeding the threshold voltage for the first bitline 604 and the second bitline 606.

Figure 7:
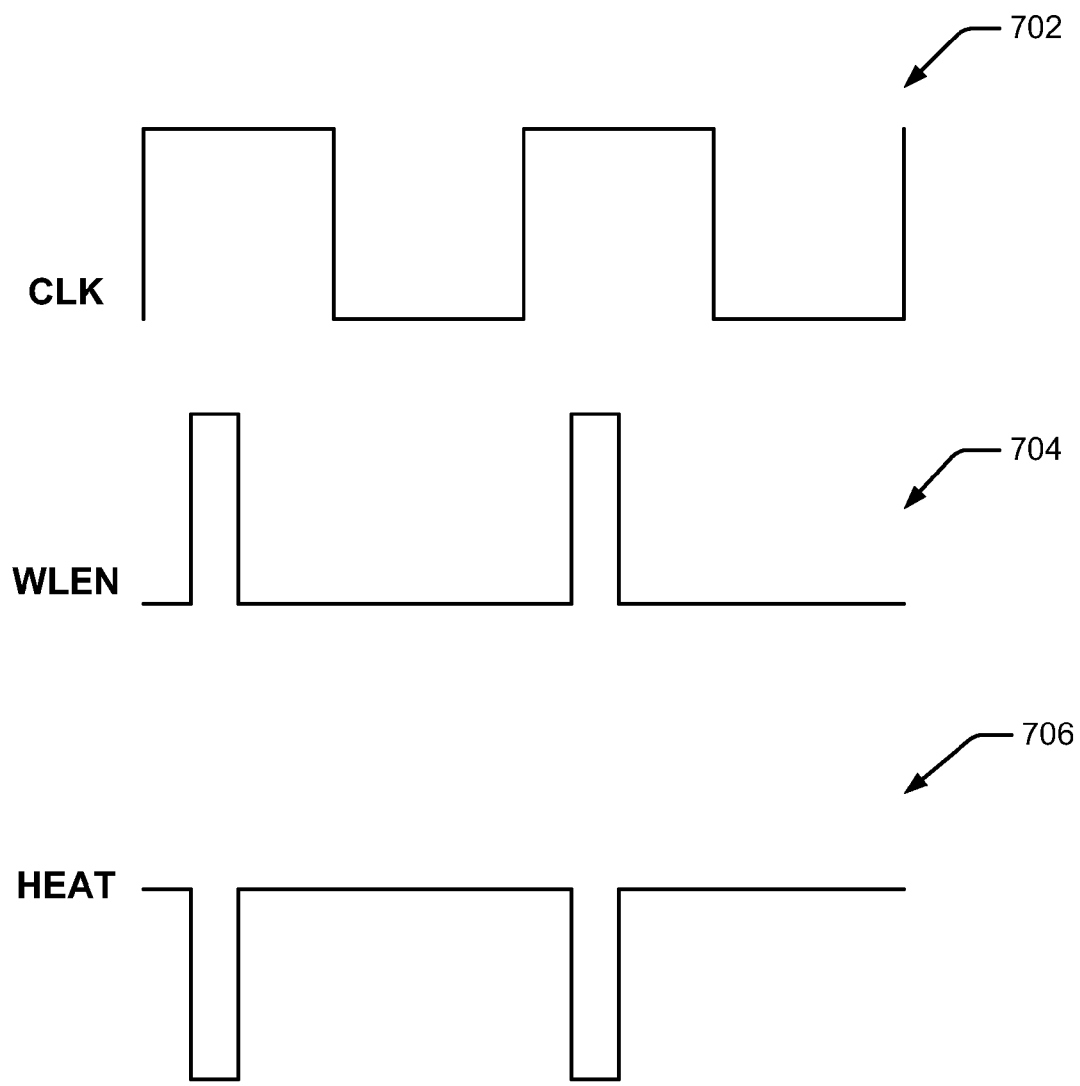
FIG. 7 is a timing diagram showing a clock signal and a memory access signal and a memory cell heating signal in relation to the clock signal.

FIG. 7 is a timing diagram showing a clock signal, CLK, 702 and a memory access signal, WLEN, 704 and a memory cell heating signal, HEAT, 706, in relation to the clock signal 702. The clock signal 702 represents a signal used to coordinate actions of electronic circuits of a computing device, such as the computing device 100 of FIG. 1. In addition, during the active portion of the memory access signal 704, accesses to memory cells of an array may take place.

In an illustrative implementation, the clock signal 702 may have a clock cycle that lasts a specified period of time, such as a few nanoseconds. The memory access signal 704 is active just after the rising edge of the clock signal 702 and the memory access signal 704 lasts for only a fraction of the time associated with the clock cycle. Heating of bitlines of arrays of memory cells according to the arrangements shown in FIGS. 3-6 may leverage this difference between the duration of the memory access signal 704 and the duration of the clock signal 702 to increase the temperature of the arrays for testing purposes. For example, since the memory access signal 704 is only active for a portion of the clock signal 702, accesses to memory cells may be completed before the end of the clock cycle. This leaves the bitlines of an array of memory cells free to receive a heating current during the remainder of the clock cycle. Thus, the memory cell heating signal 706 may be active during the portion of the clock cycle when the memory access signal 704 is inactive and a heating current may be provided to the bitlines of an array of memory cells during this time. In this way, an efficient heating of an array of memory cells can take place using bitlines of the array with only brief interruptions during the active portion of the memory access signal 704.

Figure 8:
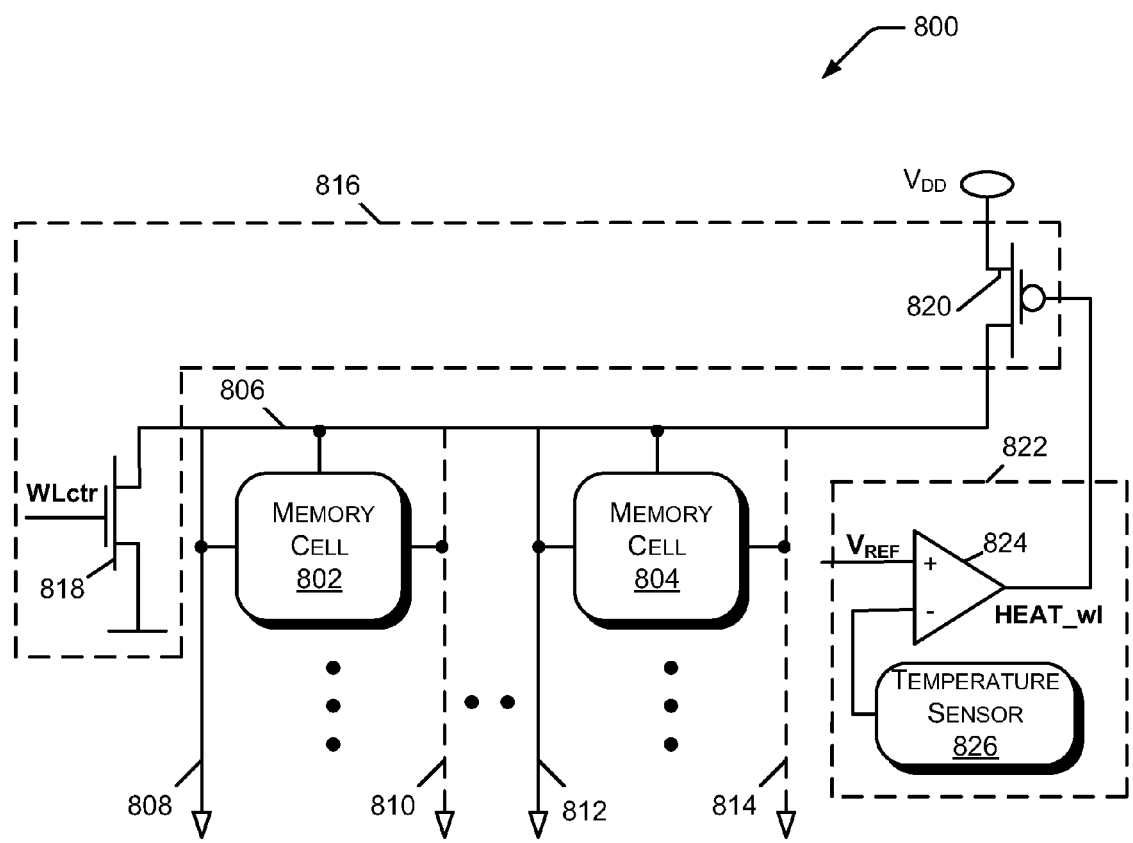
FIG. 8 is a schematic diagram of an array of memory cells including a plurality of bitlines and at least one wordline coupled to a wordline heating arrangement.

FIG. 8 is a schematic diagram of an array 800 of memory cells including a plurality of bitlines and at least one wordline coupled to a wordline heating arrangement. The array 800 includes a first memory cell 802 and a second memory cell 804. The array 800 may include a number of additional columns of memory cells between the first memory cell 802 and the second memory cell 804. In addition, the array 800 may include a number of rows of memory cells in addition to the row including the first memory cell 802 and the second memory cell 804. The array 800 also includes a wordline 806 coupled to the first memory cell 802 and the second memory cell 804. Further, the array 800 includes a first bitline 808 coupled to a number of memory cells of the array 800 including the first memory cell 802. The array 800 may also include an optional second bitline 810 coupled to the column of memory cells including the first memory cell 802. The array 800 includes a third bitline 812 coupled to a number of memory cells including the second memory cell 804. The array 800 may also include an optional fourth bitline 814 coupled to the column of memory cells including the second memory cell 804.

Additionally, the array 800 includes a wordline heating arrangement 816. The wordline heating arrangement 816 provides a heating current to the wordline 806 to heat the array 800 for testing purposes to identify defects of the array 800. The wordline heating arrangement 816 includes a negative channel metal oxide semiconductor (NMOS) transistor 818. A drain of the NMOS transistor 818 is coupled to the wordline 806 and a source of the NMOS transistor 818 is grounded. A gate of the NMOS transistor 818 receives a control signal WLctr to activate the wordline 806, such as during accesses to data stored in the memory cells of the array 800. The wordline heating arrangement 816 also includes a positive channel metal oxide semiconductor (PMOS) transistor 820. A source of the PMOS transistor 820 is coupled to a positive supply voltage, $V_{DD}$, and a drain of the PMOS transistor 820 is coupled to the wordline 806.

A gate of the PMOS transistor 820 is coupled to a temperature controller 822. The temperature controller 822 includes a comparator 824 and a temperature sensor 826. A non-inverting input of the comparator 824 may receive a signal $V_{REF}$. The signal $V_{REF}$ may indicate a target temperature of the array 800 expressed in volts. An inverting input of the comparator 824 may receive a signal from the temperature sensor 826. The temperature sensor 826 may provide a signal to the comparator 824 indicating a current temperature of the array 800 expressed in volts. In this way, the comparator 824 may output the control signal, HEAT_w1, when the current temperature of the array 800 is lower than the target temperature specified by $V_{REF}$. Thus, the PMOS transistor 820 may be activated by the control signal HEAT_w1 to provide a heating current to the wordline 806. Further, when the current temperature of the array 800 is higher than the target temperature, the comparator 824 may not provide the control signal HEAT_w1 to the PMOS transistor 820. Consequently, heating of the array 800 may be controlled, such that the temperature of the array 800 is increased by providing current to the wordline 806 until a target temperature is achieved.

In some embodiments, a heating voltage of the wordline 806 is limited to a threshold voltage in order to prevent activation of the memory cells of the array 800. For example, the heating voltage of the wordline 806 may be limited to 0.1 to 0.2 volts to prevent activation of the bitlines 808-814 and prevent inadvertently changing data stored by the first memory cell 802 and the second memory cell 804.

Figure 9:
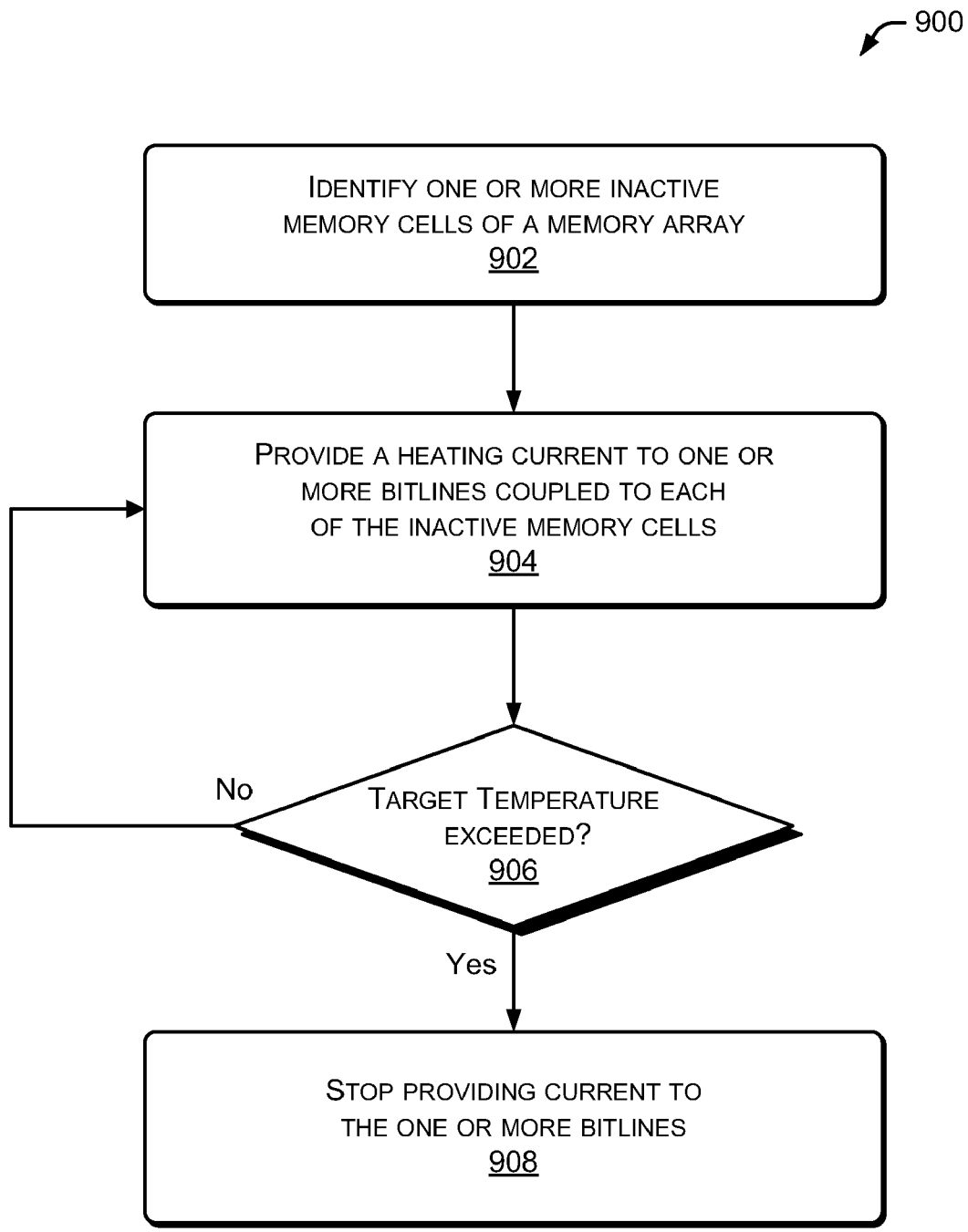
FIG. 9 is a flow diagram of a method to provide current to bitlines coupled to inactive memory cells to heat an array of memory cells.
Figure 10:
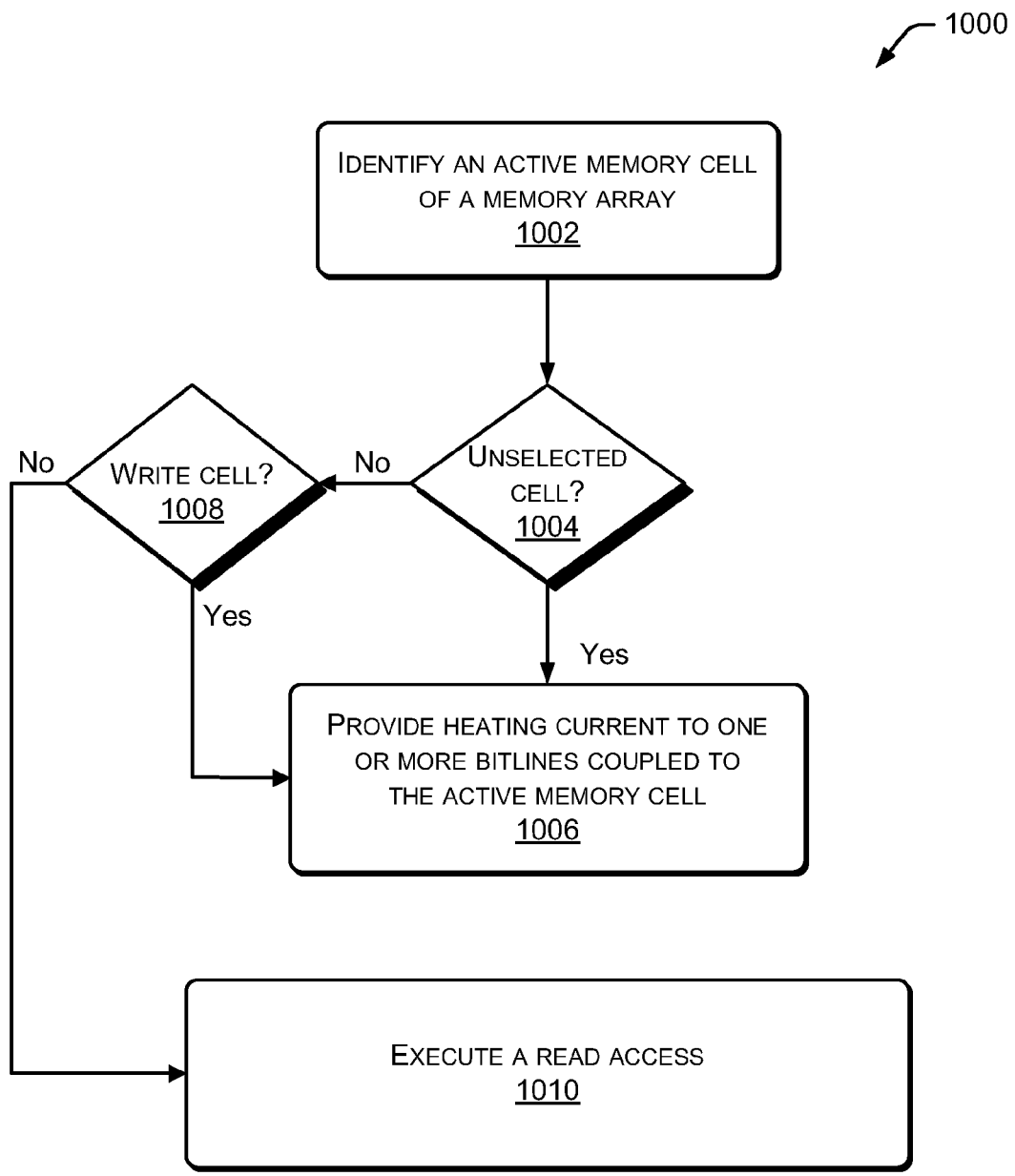
FIG. 10 is a flow diagram of a method to provide current to bitlines coupled to active memory cells to heat an array of memory cells.
Figure 11:
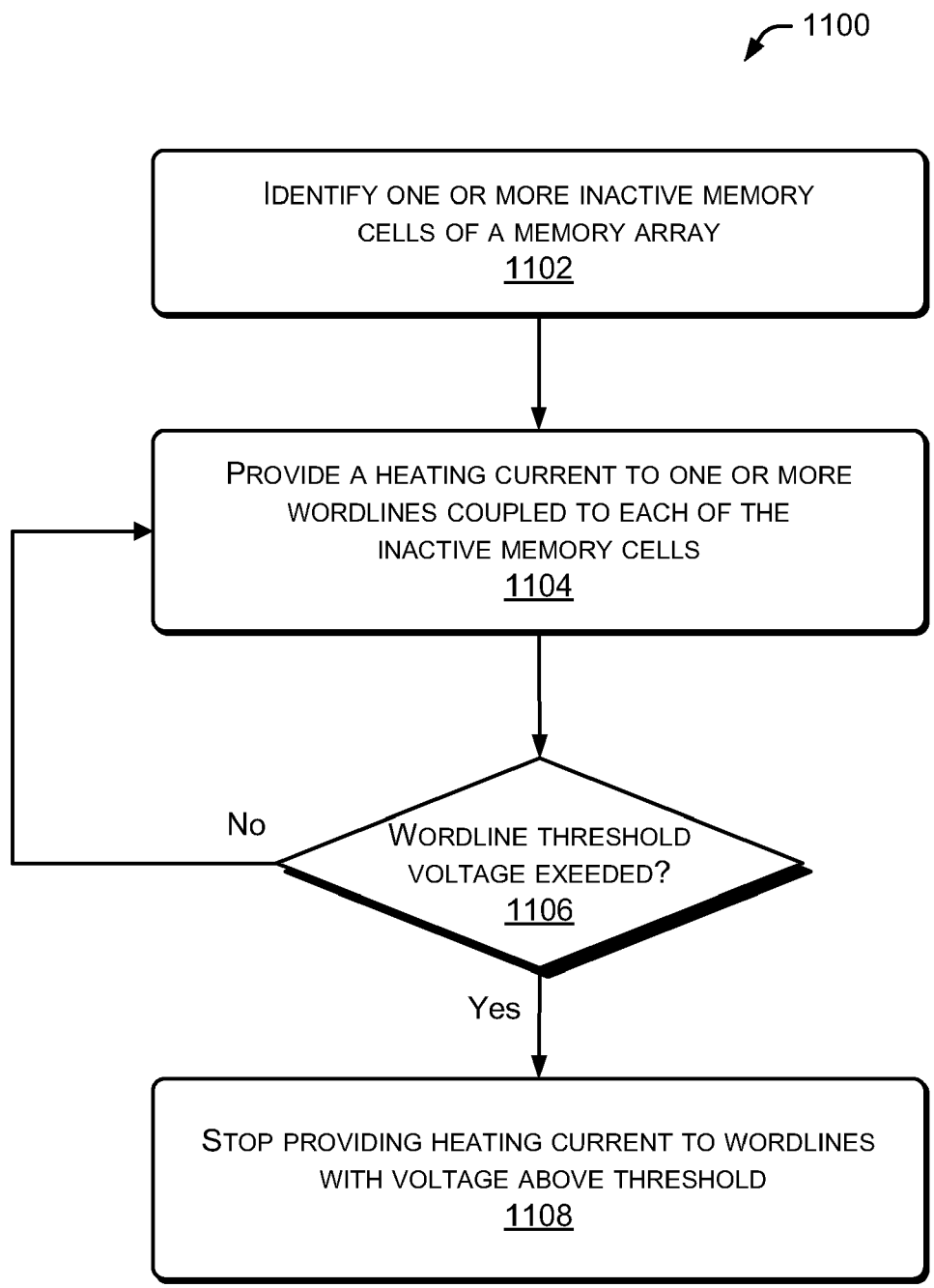
FIG. 11 is a flow diagram of a method to provide current to wordlines coupled to inactive memory cells to heat an array of memory cells.

FIGS. 9-11 include flow diagrams of illustrative methods of integrated heating utilizing bitlines and wordlines for testing memory cells. The methods of FIGS. 9-11 may, but need not necessarily, be implemented using the computing device 100 shown in FIG. 1. For example, computer-readable instructions executable by a processor to perform the methods of FIGS. 9-11 may be stored in the bitline heating module 128 and the wordline heating module 130 of FIG. 1. Additionally, the methods illustrated in FIGS. 9-11 may be implemented utilizing arrays of memory cells, such as the arrays of FIGS. 2-6.

Specifics of exemplary methods are described below. The process is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in any order and/or in parallel to implement the methods.

FIG. 9 is a flow diagram of a method 900 to provide current to bitlines coupled to inactive memory cells to heat an array of memory cells.

At 902, one or more inactive memory cells of an array of memory cells are identified. The array may include memory cells utilizing one or more memory technologies, such as static random access memory (SRAM), dynamic random access memory (DRAM), other random access memory technologies, flash memory, erasable programmable read-only memory (EPROM), electrically erasable programmable read-only memory (EEPROM), other read-only memory technologies, or a combination thereof. The array of memory cells may include a number of columns of bitlines coupled to the memory cells of the array and a number of rows of wordlines coupled to the memory cells of the array. In one example, SRAM cells may be coupled to two bitlines, a bitline and a complementary bitline. In other examples, DRAM cells and flash memory cells may be coupled to a single bitline.

At 904, a heating current is provided to one or more bitlines coupled to each of the inactive memory cells. In some embodiments, the current may be provided via a precharge circuit and the one or more bitlines are kept under precharge to increase the temperature of the array. In other embodiments, a heating element may be activated to provide the heating current to the bitlines to increase the temperature of the array.

At 906, a determination is made as to whether the testing temperature of the array has been exceeded. When the testing temperature of the array has not been exceeded, the method returns to 904 in order to continue providing a heating current to bitlines of the array and to further increase the temperature of the array.

At 908, when the testing temperature of the array has been achieved, a heating current is no longer provided to the bitlines of the array.

FIG. 10 is a flow diagram of a method 1000 to provide current to bitlines coupled to active memory cells to heat an array of memory cells.

At 1002, active memory cells of an array of memory cells are identified. The memory cells may be considered active when accesses, such as read accesses and write accesses, are taking place with respect to the memory cells or when accesses are taking place with respect to memory cells in the same row as one or more memory cells whose data is being accessed.

At 1004, a determination is made as to whether the active memory cell is an unselected cell. That is, data of the cell is not being accessed, but the cell is in the same row as one or more cells with data that is being accessed. When the cell is an unselected cell, the method proceeds to 1006.

At 1006, a heating current is provided to one or more bitlines coupled to the unselected cell. When the memory cell is not an unselected cell, the method advances to decision 1008.

At 1008, a determination is made as to whether the active cell is associated with a write access. When a cell is associated with a write access, the method proceeds to 1006 where a heating current is provided to one or more bitlines coupled to the write cell. When the memory cell is not an unselected cell or a write cell, the method moves to 1010.

At 1010, a read access is performed with respect to the active memory cell. When the memory cell is associated with a read access, a heating current is not provided to the bitline(s) coupled to the cell. A heating current is not provided to the bitline(s) in order to prevent interference with the read operation, since the data of the memory cell is identified based on a difference between the voltages of a bitline and a complementary bitline coupled to the cell, in the case of an SRAM cell, and based on the voltage of a single bitline coupled to the cell, in the case of a DRAM cell.

FIG. 11 is a flow diagram of a method 1100 to provide current to wordlines coupled to inactive memory cells to heat an array of memory cells.

At 1102, one or more inactive memory cells of an array of memory cells are identified.

At 1104, a heating current is provided to one or more wordlines coupled to each of the inactive memory cells. In this way, the temperature of the array may be increased to identify defects of the array.

At 1106, a determination is made as to whether a wordline threshold voltage is exceeded. When the wordline threshold voltage is not exceeded, the method returns to 1104 and the heating current continues to be provided to the one or more wordlines. When the wordline threshold voltage is exceeded, the method advances to 1108.

At 1108, the heating current is no longer provided to the wordlines. In this way, the voltage of the wordline does not exceed a threshold which may corrupt data stored at the memory cells coupled to the one or more wordlines.

Conclusion

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

I claim:

1. An apparatus comprising:
    a plurality of memory cells;
    a plurality of bitlines, wherein each memory cell is coupled to one or more of the plurality of bitlines; and
    a plurality of memory cell heating elements, wherein each memory cell heating element is coupled to at least one of the plurality of bitlines, and each of the plurality of memory cell heating elements is configured to provide current to the at least one of the plurality of bitlines to increase a temperature of at least a portion of the plurality of memory cells.

2. The apparatus of claim 1, wherein each of the memory cell heating elements comprises one or more negative channel metal oxide semiconductor (NMOS) transistors and each of the one or more NMOS transistors is coupled to a corresponding bitline.

3. The apparatus of claim 1, wherein each bitline is coupled to a respective precharge circuit.

4. The apparatus of claim 3, wherein each respective precharge circuit includes one or more positive channel metal oxide semiconductor (PMOS) transistors and each of the one or more PMOS transistors is coupled to a corresponding bitline.

5. The apparatus of claim 1, wherein a control signal is provided to a memory cell heating element to provide current through a particular bitline coupled to the memory cell heating element.

6. The apparatus of claim 1, further comprising a temperature controller coupled to at least one of the plurality of memory cell heating elements.

7. The apparatus of claim 6, wherein the temperature controller comprises a temperature sensor to determine a temperature of the apparatus.

8. The apparatus of claim 7, wherein the temperature controller includes a comparator to compare the temperature of the apparatus with a target temperature.

9. The apparatus of claim 8, wherein a control signal is sent from the comparator to activate at least one heating element when the temperature of the apparatus is less than the target temperature.

10. The apparatus of claim 1, wherein a number of memory cells are coupled to a first bitline and a second bitline, wherein the first bitline is coupled to a first switch and the second bitline is coupled to a second switch, and wherein a first control signal is provided via the first switch to activate a first heating element coupled to the first bitline, a second control signal is provided via the second switch to activate a second heating element coupled to the second bitline, or the first control signal is provided via the first switch and the second control signal is provided via the second switch to activate the first heating element and the second heating element.

11. The apparatus of claim 1, further comprising a bitline voltage control arrangement to provide a first control signal to activate at least one heating element.

12. The apparatus of claim 11, wherein the bitline voltage control arrangement includes a dummy bitline and the first control signal is provided to the at least one heating element when a voltage of the dummy bitline is below a threshold voltage.

13. The apparatus of claim 12, further comprising a switch coupled to the at least one heating element, and wherein a second control signal is provided to the switch when the voltage of the dummy bitline exceeds the threshold voltage, the second control signal to operate the switch to cut off the first control signal from the at least one heating element.

14. The apparatus of claim 12, further comprising a temperature controller coupled to the bitline voltage control arrangement, the temperature controller to provide an additional control signal to activate a heating element of the bitline voltage control arrangement, wherein the heating element of the bitline voltage control arrangement is coupled to the dummy bitline.

15. The apparatus of claim 14, wherein the temperature controller provides the additional control signal to the heating element of the bitline voltage control arrangement when a temperature of the apparatus is less than a target temperature, and wherein the target temperature is provided by the bitline voltage control arrangement.

16. A method comprising:
identifying one or more inactive memory cells of an array of memory cells; and
providing a heating current to at least one bitline coupled to the one or more inactive memory cells during a period when no attempts are made to access data stored by the one or more inactive memory cells.

17. The method of claim 16, wherein precharge current is provided to the at least one bitline via a precharge circuit coupled to the at least one bitline and the heating current is provided to the at least one bitline via a heating element coupled to the at least one bitline.

18. A method comprising
identifying one or more active memory cells of an array of memory cells;
identifying an unselected active memory cell of the one or more active memory cells; and
providing a heating current to at least one bitline coupled to the unselected active memory cell.

19. The method of claim 18, further comprising:
identifying an additional active memory cell associated with a write access;
providing a precharge current to at least one bitline coupled to the additional active memory cell associated with the write access; and
providing the heating current to the at least one bitline coupled to the additional active memory cell after providing the precharge current.

20. The method of claim 19, wherein the heating current is provided to the at least one bitline coupled to the additional active memory cell after completion of a memory access cycle associated with the write access to the additional active memory cell.

21. The method of claim 20, wherein the memory access cycle is completed in less time than a clock cycle associated with a computing device to which the additional active memory cell is coupled.

22. The method of claim 18, wherein the heating current is provided to the at least one bitline coupled to the unselected active memory cell until a threshold voltage of the at least one bitline is attained.

23. An apparatus comprising:
a plurality of memory cells;
a wordline coupled to each of the plurality of memory cells; and
a wordline heating arrangement coupled to the wordline and configured to provide a current to the wordline to increase a temperature of one or more inactive memory cells of the plurality of memory cells.

24. The apparatus of claim 23, wherein the wordline heating arrangement includes a positive channel metal oxide semiconductor (PMOS) transistor coupled to the wordline, wherein the PMOS transistor receives a control signal to provide current to the wordline when the plurality of memory cells are inactive.

25. The apparatus of claim 24, wherein the wordline heating arrangement is coupled to a temperature controller and the temperature controller provides the control signal to the PMOS transistor until a threshold voltage of the wordline is attained.

* * * * *